United States Patent [19]

Morong

[11] Patent Number: 4,547,730
[45] Date of Patent: Oct. 15, 1985

[54] LIGHT LOAD ADJUST APPARATUS FOR ELECTRIC METER

[75] Inventor: William H. Morong, Durham, N.H.

[73] Assignee: General Electric Company, Somersworth, N.H.

[21] Appl. No.: 590,973

[22] Filed: Mar. 19, 1984

[51] Int. Cl.[4] .............................. G01R 11/02
[52] U.S. Cl. .................................. 324/137
[58] Field of Search ............ 324/137, 138, 152; 335/225

[56] References Cited

U.S. PATENT DOCUMENTS

| | | | |
|---|---|---|---|
| 2,352,965 | 7/1944 | Mendelsohn | 324/137 |
| 3,493,862 | 2/1970 | Ramsey | 324/137 |
| 3,496,466 | 2/1970 | Takabayashi | 324/137 |
| 4,423,375 | 12/1983 | Ramsey | 324/137 |
| 4,424,484 | 1/1984 | Ramsey | 324/137 |
| 4,424,485 | 1/1984 | Zisa | 324/137 |

Primary Examiner—Stanley T. Krawczewicz
Assistant Examiner—Jose M. Solis
Attorney, Agent, or Firm—Robert E. Brunson

[57] ABSTRACT

A light load adjustment for an electric meter includes a frame attachable to a core of a voltage coil and a pole-shading element slideable with respect to the frame. The pole-shading element includes a windowed plate or a pair of tabs interposeable between the core of the voltage coil and the rotatable disk and effective to change the direction and magnitude of the torque applied to the rotatable disk of the electric meter at light load. A single adjusting screw for the light load adjustment is placed in one of its two alternative positions. In either of its two alternative positions, rotation of the head of the adjusting screw by a worker facing the head produces a displacement of the windowed plate or tabs which tends to change the disk speed in a sense which is consistent with the convention for the relationship between the direction of rotation of an adjustment and the change in disk speed.

5 Claims, 4 Drawing Figures

LIGHT LOAD ADJUST APPARATUS FOR ELECTRIC METER

BACKGROUND OF THE INVENTION

The present invention relates to electric meters and, more particularly, to a light load adjustment for electric meters.

Conventional electric meters employ an aluminum disk driven as a rotor of a small induction motor by an electric field at a speed which is proportional to the electric power being consumed by a load. Geared dials or cyclometer discs integrate the disk motion to indicate the total energy consumed, conventionally measured in kilowatt hours (one kilowatt hour equals one thousand watts of power consumption for one hour).

The speed of the rotor disk is controlled by the competing torques of a rotating electric field and of eddy current losses induced in the disk by rotation within the influence of a permanent magnet. The rotating electric field is produced by one or more voltage coils on one side of the disk and one or more current coils on the other side of the disk. The voltage coils conventionally include a large number of turns of fine insulated wire wound on the center leg of an E-shaped laminated core. The current coils conventionally include a small number of (two or more) turns of heavy conductor on a U-shaped laminated core. The voltage and current coils are arranged to produce a torque in the disk which is equal to the product of the line voltage and the load current; that is, the load power.

In order to calibrate the disk speed, adjustments are provided for full load and light load among others not of interest here. The full load speed of the disk at rated voltage and a test current is factory adjusted by increasing or reducing the magnetic flux of the permanent magnet until the desired relationship between load power and disk speed is achieved. A manual full load vernier adjustment permits shunting of a portion of the magnetic flux of the permanent magnet to provide final control of disk speed at full load.

Even when the disk is adjusted for precise speed at full load, core non-linearities, friction and mechanical or magnetic dissymmetries may produce errors in the relationship between load and disk speed at light loads of, for example, about 10 percent of full load. A light load adjustment is provided to vary the torque applied to the disk at light load either in the direction of motion or against the direction of motion until the desired power and speed relationship is attained. The light load adjustment may conventionally include a light load plate of conductive or magnetic material having a rectangular window punched therethrough or it may include a bar having a pair of tabs of magnetic material interposed between the outer legs of the core of the voltage coil and the disk. When the window or the tabs are symmetrical to the pole of the voltage coil, they contribute zero torque to the disk. The plate or tabs may be displaced parallel to the plane of the disk so that they align with, or shade, one of the outer legs of the E-shaped core of the voltage coil more than they shade the other outer leg. This generates a dissymmetry in the magnetic flux and the resultant torque, produced by the voltage coil which has a magnitude related to the difference in shading of the two outer legs and a direction related to the direction in which the loop or tabs are adjusted.

The light load adjustment is conventionally controlled by rotating a screw which thereby provides a limited translation of the light load plate or tabs. Such a light load adjustment is disclosed, for example, in U.S. Pat. Nos. 4,423,375; 4,424,484 and 4,424,485. A rigid convention has been adopted for the direction of rotation of controls used for adjusting disk speed. According to this convention, turning a control in the clockwise direction slows the disk rotation and turning a control in the counterclockwise direction speeds up the disk rotation.

Some electric meters employ two or three voltage coils in order to combine the power usage data from two or more phases of the load power into rotation of a single disk. In one such arrangement, two voltage coils are arranged 180 degrees apart about the circumference of the disk. Each of the voltage coils may be provided with its own light load adjustment for improved precision under assymmetric loading of the phases. It is convenient to position the light load adjustment screws for both voltage coils facing toward the front of the meter so that a worker has easy access to them from a single location. However, their locations spaced 180 degrees apart about the circumference of the disk requires that the displacements of the light load adjustments must be in opposite directions with respect to the worker in order to obtain the same change in disk speed. This causes a problem in meeting the standard that the direction of rotation of the adjustment screws must produce the same direction of change in disk speed.

Similar problems exist when, for example, three voltage coils are spaced 120 degrees apart about the disk.

One way that such adjustment problems might be solved is to provide two different adjustment linkages, one with a right-hand threaded screw and the other with a left-hand threaded screw. In this arrangement, one of the adjustment linkages may be used on one of the voltage transformers and the other adjustment linkage may be used on the other voltage transformer. This technique suffers the cost disadvantage that two different linkages, and perhaps even two different voltage transformers assembled with their respective linkages, must be manufactured and stocked.

OBJECTS AND SUMMARY OF THE INVENTION

Accordingly, it is an object of the invention to provide a light load adjustment for an electric meter which overcomes the drawbacks of the prior art.

It is a further object of the invention to provide a light load adjustment for an electric meter which provides the same sense of adjustment of disk speed for a given direction of adjustment rotation regardless of the end of the voltage coil at which the adjustment is performed.

Briefly stated, the present invention provides a light load adjustment for an electric meter which includes a frame attachable to a core of a voltage coil and a pole-shading element slideable with respect to the frame. The pole-shading element includes a windowed plate or a pair of tabs interposeable between the core of the voltage coil and the rotatable disk and effective to change the direction and magnitude of the torque applied to rotatable disk of the electric meter at light load. A single adjusting screw for the light load adjustment is placed in one of its two alternative positions. In either of its two alternative positions, rotation of the head of the adjusting screw by a worker facing the head produces a displacement of the windowed plate or tabs which tends to change the disk speed in a sense which is consistent with the convention for the relationship between the direction of rotation of an adjustment and the change in disk speed.

According to an embodiment of the invention, there is provided a light load adjustment for an electric meter, the electric meter being of the type including at least a voltage coil having a core and a rotatable disk rotatable by a magnetic field at least partly produced by the voltage coil, the core having at least first and second legs disposed within a magnetic influence of the disk, comprising a frame rigidly attachable to the core, a carrier, means for slidably guiding the carrier on the frame along an axis parallel to a plane of the disk, pole-shading means on the carrier disposable between the first and second legs and the disk and effective for at least partly distorting the magnetic field whereby a light load adjustment torque is applied to the disk, a single light load adjustment screw, first and second alternative locations for the adjustment screw in the frame and the carrier, the first and second locations permitting adjustment access to the adjustment screw from first and second different locations with respect to the core, the first and second different locations being 180 degrees apart about the core and means at the first location for displacing the carrier in a first direction along the axis in response to rotation of the adjustment screw in a first rotational direction and for displacing the carrier in a second opposite direction along the axis in response to rotation of the adjustment screw in a second rotational direction, and means at the second location for displacing the carrier in the same first direction along the axis in response to rotation of the adjustment screw in the same first rotational direction and for displacing the carrier in the same second direction along the axis in response to rotation of the adjustment screw in the same second rotational direction whereby the rotation of the adjustment screw in one of the first and second rotational directions produces a displacement of the carrier in the same direction regardless of whether the single adjustment screw is disposed in the first or the second alternate locations.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
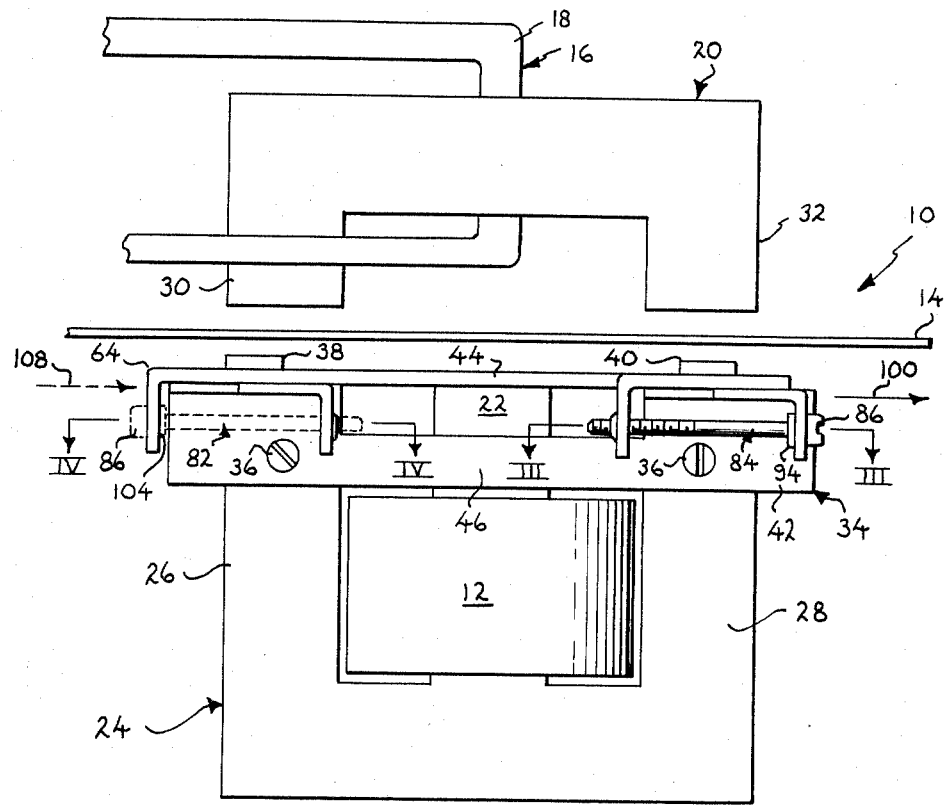
FIG. 1 is a partial view of an electric meter including a light load adjustment according to an embodiment of the invention.

Referring now to FIG. 1, there is shown, generally at 10 an induction motor in an electric meter. Induction motor 10 includes a voltage coil 12 on one side of a rotatable aluminum disk 14 and a current coil 16 on the other side of rotatable aluminum disk 14. As is conventional, current coil 16 includes a small number of turns of a heavy conductor 18 passing through a U-shaped magnetic core 20. Typically, two or more turns of current coil 16 are employed. The load current, or a current proportional to the load current, passes through current coil 16 and thereby produces a magnetic flux in U-shaped magnetic core 20.

Voltage coil 12 consists of a large number of turns of a fine insulated wire wound on a center leg 22 of an E-shaped magnetic core 24. The voltage appearing across the load is applied to voltage coil 12. Outer legs 26 and 28 of E-shaped magnetic core 24 are disposed adjacent rotatable aluminum disk 14 generally opposed to legs 30 and 32 of current coil 16. A light load adjustment 34 is affixed to outer legs 26 and 28 adjacent rotatable aluminum disk 14 using, for example, a bolt or rivet 36 through each of outer legs 26 and 28. The load voltage applied to voltage coil 12 induces a magnetic flux in E-shaped magnetic core 24 which, when combined with the magnetic flux produced in U-shaped magnetic core 20 by the current in current coil 16, produces a torque on rotatable aluminum disk 14 which is proportional to the product of the load current and the voltage.

Figure 2:
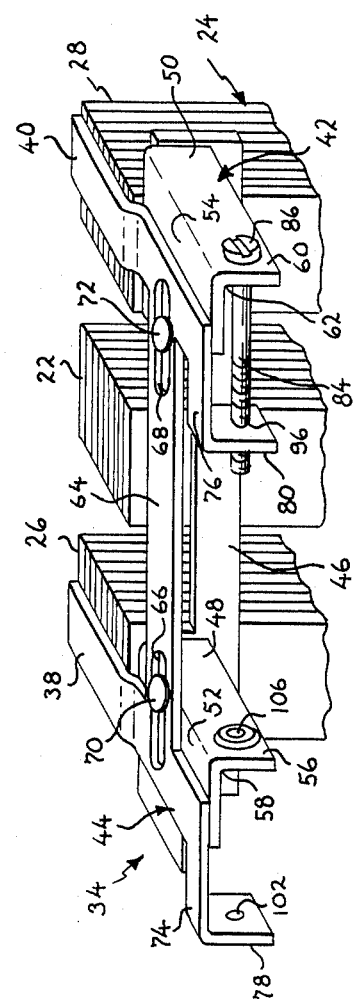
FIG. 2 is a close-up perspective view of the light load adjustment of FIG. 1.

Although light load adjustment 34 may be of the conductive plate or the tab type without departing from the scope of the invention, for concreteness of description, light load adjustment 34 is chosen to be of the type having a pair of tabs 38 and 40 of magnetic material overlaying outer legs 26 and 28 respectively. Referring now also to FIG. 2, light load adjustment 34 consists of a frame 42 and a tab carrier 44. Frame 42 is affixed to outer legs 26 and 28. Tab carrier 44 is transversely movable with respect to frame 42 and E-shaped magnetic core 24 to thereby displace tabs 38 and 40 in a direction parallel to the plane of rotatable aluminum disk 14.

Frame 42 includes a transverse bar 46 secured parallel to outer legs 26 and 28 and first and second platform portions 48 and 50 having upper bearing surfaces 52 and 54 respectively disposed at right angles to the plane of transverse bar 46. Platform portions 48 and 50 are preferably integrally formed with transverse bar 46 using, for example, an appropriately shaped piece of sheet metal in which right angle bends (not shown) may be made to position upper bearing surfaces 52 and 54 in the positions shown. A dependent lip 56 is formed by a right angled bend 58 at an end of upper bearing surface 52 nearer the center of E-shaped magnetic core 24. A dependent lip 60 is formed by a right angled bend 62 at an end of upper bearing surface 54 further from the center of E-shaped magnetic core 24.

Tab carrier 44 includes a connecting bar 64 having a pair of aligned longitudinal slots 66 and 68 therein. A shoulder rivet 70, affixed in upper bearing surface 52 passes guidingly through longitudinal slot 66. Similarly, a shoulder rivet 72 passes guidingly through longitudinal slot 68. Tab carrier 44 is permitted to displace a limited distance transversely in the guidance direction defined by longitudinal slots 66 and 68. A support portion 74 at one end of tab carrier 44 overlies upper bearing surface 52 of frame 42. Similarly, a second support portion 76 at the other end of tab carrier 44 overlies upper bearing surface 54 of frame 42. A dependent lip 78 is formed at an end of support portion 74 further from the center of E-shaped magnetic core 24. A dependent lip 80 is formed at the end of support portion 76 nearer to the center of E-shaped magnetic core 24.

A single adjusting screw 84 is employed in one of two alternate locations in light load adjustment 34 to position tab carrier 44 with respect to outer legs 26 and 28. One of the alternate locations for adjustment screw 84 is shown in solid line between dependent lips 60 and 80. The other of the alternate locations for adjustment screw 84 is shown in dashed line between dependent lips 56 and 78.

Figures 3, 4:
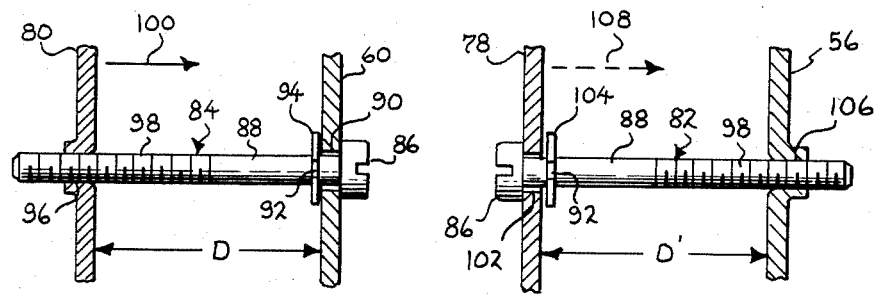
FIG. 3 is a cross section taken along III—III in FIG. 1 showing the adjustment screw in one of its two alternative locations.
FIG. 4 is a cross section taken along IV—IV in FIG. 2 showing the adjustment screw in the other of its two alternate locations.

Referring now to the cross section in FIG. 3 showing adjusting screw 84 in its solid line position between dependent lip 60 and dependent lip 80 at the right side of FIGS. 1 and 2, it will be noted that adjusting screw 84 includes an enlarged head 86 abutting one surface of dependent lip 60 and a shaft 88 passing through a hole 90 in dependent lip 60. A groove 92 retains a C-washer 94 against the other surface of dependent lip 60 to thereby permit rotation of adjusting screw 84 without permitting it to displace with respect to dependent lip 60 (that is, with respect to frame 42). A threaded hole 96 threadably engages a threaded portion 98 on adjusting screw 84. Rotation of adjusting screw 84 is effective to displace dependent lip 80, and the remainder of tab carrier 44 with it, by changing the separation D between dependent lip 60 and dependent lip 80. If adjusting screw 84 has, for example, a left hand thread, rotation of adjusting screw 84 in the counterclockwise direction is effective to reduce the separation dimension D and to thereby displace tab carrier 44 in the rightward direction indicated by a solid arrow 100.

Referring now to FIG. 4, showing adjusting screw 84 in its alternate position between dependent lip 78 and dependent lip 56, enlarged head 86 is seen to be disposed against a surface of dependent lip 78 with its shaft 88 passing through a hole 102 in dependent lip 78. A C-washer 104, fitted into a groove 92 in shaft 88 bears against the other side of dependent lip 78 to retain adjusting screw 84 against displacement with respect to dependent lip 78, and thereby with respect to tab carrier 44, but to allow rotation of adjusting screw 84 about its longitudinal axis. A threaded hole 106 in dependent lip 56 threadably engages threaded portion 98 of adjusting screw 84. If adjusting screw 84 is equipped with left hand threads and if its enlarged head 86 is rotated counterclockwise, separation distance D' is decreased and dependent lip 78, along with the remainder of tab carrier 44, is moved rightward in FIGS. 1 and 2 as indicated by a dashed arrow 108. Thus a worker facing enlarged head 86 of adjusting screw 84 in either of its alternate locations and rotating enlarged head 86 in the same direction relative to the direction in which he is facing produces a displacement of tab carrier 44 in the same direction even though adjusting screw 84 is rotated in opposite directions when considered in a uniform coordinate system.

According to the preceding, it will be seen that a single light load adjustment 34 is capable of permitting adjustment of the light load speed of a disk of an electric meter while adhering to a uniform convention relating the direction of adjustment to the direction of change in disk speed. In addition, the only change which must be made in order to accommodate changing the location for making adjustment of light load adjustment 34 from one end to the other of light load adjustment 34 includes merely relocating adjusting screw 84 from one of its alternate locations to the other thereof.

The use of C-washer 104 to captivate adjusting screw 84 with respect to one of the elements between which it extends is, of course, only one of the ways in which control of the separation distance D (or D') may be achieved. In some applications, it may be preferable to employ a biasing coil spring (not shown) fitted over adjusting screw 84 to exert an outward bias force between dependent lip 60 and dependent lip 80 or between dependent lip 56 and dependent lip 78.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A light load adjustment for an electric meter, said electric meter being of the type including at least a voltage coil having a core and a rotatable disk rotatable by a magnetic field at least partly produced by said voltage coil, said core having at least first and second legs disposed within a magnetic influence of said disk, comprising:

a frame rigidly attachable to said core;
a carrier;
means for slidably guiding said carrier on said frame along an axis parallel to a plane of said disk;
pole-shading means on said carrier disposable between said first and second legs and said disk and effective for at least partly distorting said magnetic field whereby a light load adjustment torque is applied to said disk;
a single light load adjustment screw;
first and second alternative locations for said adjustment screw in said frame and said carrier, said first and second locations permitting adjustment access to said adjustment screw from first and second different locations with respect to said core, said first and second different locations being 180 degrees apart about said core; and
means at said first location for displacing said carrier in a first direction along said axis in response to rotation of said adjustment screw in a first rotational direction and for displacing said carrier in a second opposite direction along said axis in response to rotation of said adjustment screw in a second rotational direction, and means at said second location for displacing said carrier in the same first direction along said axis in response to rotation of said adjustment screw in the same first rotational direction and for displacing said carrier in the same second direction along said axis in response to rotation of said adjustment screw in the same second rotational direction whereby said rotation of said adjustment screw in one of said first and second rotational directions produces a displacement of said carrier in the same direction regardless of whether said single adjustment screw is disposed in said first or said second alternate locations.

2. A light load adjustment according to claim 1 wherein said means for slidably guiding includes first and second aligned slots in one of said frame and said carrier and first and second rivets in the other of said frame and said carrier, said first and second rivets passing through said first and second aligned slots respectively.

3. A light load adjustment according to claim 1 wherein said carrier includes a transverse bar spanning said first and second legs and first and second platform portions disposed substantially at right angles to said bar at opposed ends of said bar, said means for slidably guiding being disposed on said first and second platform portions and engaging aligned slots in said carrier.

4. A light load adjustment according to claim 3 wherein said means at said first location includes a first dependent lip on said frame and a second dependent lip on said carrier substantially parallel to and facing said first dependent lip, said first dependent lip including threaded means engageable by said single light load adjustment screw and said second dependent lip including a through-hole permitting the passage of said adjustment screw therethrough, said means at said second location includes a third dependent lip on said frame and a fourth dependent lip on said carrier substantially parallel to and facing said third dependent lip, said fourth dependent lip including threaded means engageable by said single light load adjustment screw and said third dependent lip including a through-hole permitting the passage of said adjustment screw therethrough whereby clockwise rotation of said adjustment screw in said first and second locations produces translation of said carrier in the same direction to thereby produce a change in said torque in the same sense.

5. A light load adjustment according to claim 1 wherein said pole-shading means includes first and second metallic tabs.

* * * * *